United States Patent
Yamada et al.

(10) Patent No.: US 8,455,113 B2
(45) Date of Patent: Jun. 4, 2013

(54) ORGANIC LIGHT-EMITTING DEVICE

(75) Inventors: Naoki Yamada, Inagi (JP); Jun Kamatani, Tokyo (JP); Tomona Yamaguchi, Tokyo (JP); Akihito Saitoh, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 545 days.

(21) Appl. No.: 12/632,679

(22) Filed: Dec. 7, 2009

(65) Prior Publication Data

US 2010/0140604 A1 Jun. 10, 2010

(30) Foreign Application Priority Data

Dec. 10, 2008 (JP) .................................. 2008-314613
Sep. 10, 2009 (JP) .................................. 2009-209539

(51) Int. Cl.
*H01L 51/54* (2006.01)

(52) U.S. Cl.
USPC ........... 428/690; 428/917; 313/504; 313/506; 252/301.16; 257/40; 257/103; 257/E51.047

(58) Field of Classification Search
None
See application file for complete search history.

(56) References Cited

U.S. PATENT DOCUMENTS

| 2003/0215668 A1 | 11/2003 | Kondakov | |
|---|---|---|---|
| 2004/0076853 A1* | 4/2004 | Jarikov | 428/690 |
| 2007/0087220 A1 | 4/2007 | Alvarado | |
| 2008/0071122 A1 | 3/2008 | Inoue | |

FOREIGN PATENT DOCUMENTS

| CN | 101185177 A | 5/2008 |
|---|---|---|
| JP | 2002-359080 A | 12/2002 |
| JP | 2003-317967 A | 11/2003 |
| JP | 2007-059903 A | 3/2007 |
| JP | 2010-138091 A | 6/2010 |
| JP | 2010-138092 A | 6/2010 |
| WO | WO 2007/072741 A1 * | 6/2007 |
| WO | 2008/015945 A | 2/2008 |

OTHER PUBLICATIONS

Bongsup P. Cho, Ronald G. Harvey, "Polycyclic Fluoranthene Hydrocarbons. 2. A New General Synthesis", J. Org. Chem., vol. 52, No. 26, 1987, p. 5668-5678).

"Photoelectron Spectrophotometer in Air Surface Analyzer. Model AC-3", Jun. 11, 2012, pp. 1-6.

* cited by examiner

*Primary Examiner* — Michael H Wilson

(74) *Attorney, Agent, or Firm* — Canon U.S.A., Inc., IP Division

(57) ABSTRACT

A light-emitting layer emits light having an emission spectrum having a primary peak in the range of wavelengths of 430 to 480 nm. The light-emitting layer contains a host compound and a dopant compound. The dopant compound has an electron affinity of 2.93 eV or more higher that is than the host compound. The dopant compound in the lowest excited triplet state has an energy of 1.95 eV or less that is lower than the host compound in the lowest excited triplet state. The dopant compound has a smaller band gap than the host compound. The dopant compound is a hydrocarbon compound.

4 Claims, 3 Drawing Sheets

ORGANIC LIGHT-EMITTING DEVICE

BACKGROUND OF THE INVENTION

1. Field of the Invention

The present invention relates to an organic light-emitting device.

2. Description of the Related Art

An organic light-emitting device includes a layer containing a fluorescent or phosphorescent organic compound between an anode and a cathode, where the anode and cathode inject holes or electrons to the layer.

Excitons of the fluorescent or phosphorescent compound are thus grown, and the layer emits light when the excitons return to the ground state.

The technology of organic light-emitting devices has made considerable strides these days. Organic light-emitting devices emit bright light having various wavelengths at low applied voltage, and exhibit quick response. Accordingly, the organic light-emitting devices provide a thin, lightweight light-emitting device, promising a wide range of applications.

There remains a demand for organic light-emitting devices that emit still brighter light or have higher conversion efficiency. In addition, organic light-emitting devices can have problems with durability, such as changes of properties with time and degradation in use under conditions containing oxygen or moisture.

In order to reduce degradation of the light-emitting device through the triplet excited state by long-term use, Japanese Patent Laid-Open Nos. 2007-059903, 2002-359080 and 2003-317967 disclose, for example, a technique for doping with a triplet quencher.

For synthesizing an intermediate of indenobenzanthracene, a process of synthesis from benzanthraquinone is disclosed (J. Org. Chem., Vol. 52, No. 26, 1987, p. 5668-5678).

SUMMARY OF THE INVENTION

According to an aspect of the invention, an organic light-emitting device is provided which includes a pair of electrodes including an anode and a cathode, and a light-emitting layer containing a host compound and a dopant compound that is disposed between the pair of electrodes. The dopant compound is a hydrocarbon compound and emits light that is emitted from the light-emitting device. The light exhibits an emission spectrum having a primary peak having the highest intensity in the range of wavelengths of 430 to 480 nm. The dopant compound has an electron affinity of 2.93 eV or more that is higher than the host compound. The dopant compound in the lowest excited triplet state has an energy of 1.95 eV or less that is lower than the host compound in the lowest excited triplet state. The dopant compound has a smaller band gap than the host compound.

Further features of the present invention will become apparent from the following description of exemplary embodiments with reference to the attached drawings.

DESCRIPTION OF THE EMBODIMENTS

Figure 1:
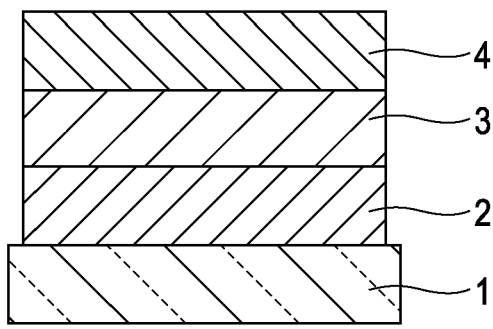
FIG. 1 is a schematic diagram of a first structure of an organic light-emitting device according to an embodiment of the invention.

Aspects of the invention will be further described in detail.

The organic light-emitting device according to an embodiment of the invention includes a pair of electrodes including an anode and a cathode, and a light-emitting layer comprising a host compound and a dopant compound that is disposed between the pair of electrodes. The organic light-emitting device emits light from the dopant compound in the light-emitting layer. The emission spectrum of the light has a primary peak having the highest intensity in the range of wavelengths of 430 to 480 nm. The host compound in the light-emitting layer has a lower electron affinity than the dopant compound. The host compound in the lowest excited triplet state has a higher energy than the dopant compound in the lowest excited triplet state. The host compound has a larger band gap than the dopant compound. More specifically, the dopant compound has an energy of 1.95 eV or less in the lowest excited triplet state and an electron affinity of 2.93 eV or more. The dopant compound is a hydrocarbon compound.

The organic light-emitting device of the present embodiment emits blue light.

One of the causes of degradation of the light-emitting layer of an organic light-emitting device may be that a material emitting light is degraded. One step of the degradation may arise through the lowest excited triplet state (T1) of the light-emitting material. Excited triplet states having a long lifetime because of spin forbidding, and exhibiting high formation probability (75%) in an organic light-emitting device gather into the T1 state. Accordingly, the step of degradation from the T1 state may be highly involved in the degradation of the light-emitting material.

An organic blue-light-emitting device which emits blue light having higher energy, that is, a light having an emission spectrum including the primary peak in the range of wavelengths of 430 to 480 nm, absorbs high energy in the light-emitting layer in the step of degradation from the T1 state, and this step is easily changed to the step of degrading the light-emitting material.

To prevent the light-emitting material from being degraded leads to an increase in lifetime of the organic light-emitting device. In the light-emitting layer containing a host compound and a dopant compound of an organic blue-light-emitting device, the dopant compound contributes to light emission. Accordingly, the present inventors thought that the step of degrading the light-emitting layer in the organic blue-light-emitting device can be prevented by minimizing the time (lifetime) for which the dopant compound is present in an excited triplet state.

The internal conversion rate constant ($k_{IC}$: s$^{-1}$) of an excited state in a non-radiative process is expressed by the following equation:

$$k_{IC} = 10^{13} exp(-\alpha \Delta E)$$

where ΔE represents the difference in energy between two states (ΔE: kJmol⁻¹).

When $k_{IC}$ is a time for which the T1 state is present (lifetime), ΔE corresponds to the energy of the T1 state, and the reduction of the T1 energy leads to a reduction of the presence time (life time) of the T1 state.

Thus, the degradation of the dopant compound can be prevented by reducing the T1 energy. The inventors thought that, for applying this concept effectively to an organic blue-light-emitting device whose light-emitting layer contains a host compound and a dopant compound, the compounds of the light-emitting layer should satisfy the following three requirements.

First requirement: the electron affinity (Ea) of the host compound is lower than that of the dopant compound. This is because the dopant compound has to receive electrons injected from the electron transport layer to form excitons.

Second requirement: the host compound in the lowest excited triplet state (T1) has a higher energy than the dopant compound in the T1 state. Consequently, the T1 state can be confined in the dopant compound.

Third requirement: the host compound has a larger band gap than the dopant compound. Consequently, the dopant compound can emit light efficiently.

In addition, it may be the case that the electron affinity of the dopant compound is reduced as much as possible so that the dopant compound can form more triplet excitons in the light-emitting layer. Consequently, electrons can be efficiently injected to the light-emitting layer from the electron transport layer.

Unfortunately, there has been no dopant compound satisfying the above-listed requirements yet for blue light-emitting devices, having a large band gap, a sufficiently low T1 energy and a sufficiently high electron affinity.

The present inventors have found through intensive research that, for example, Compound 1 shown below can satisfy the above-listed requirements, and may exhibit a sufficiently low T1 energy and a sufficiently high electron affinity.

More specifically, a light-emitting layer containing Compound 1 as the dopant compound and Compound b-2 as the host compound, as in Examples described below, may be capable of achieving superior organic blue emission. Specifically, the primary peak wavelength of the blue light is 449 nm. When a voltage was continuously applied for 100 hours with the current density kept at 33 mA/cm², the brightness of the light from such an device after 100 hours was reduced from the initial brightness by 15% or less and the reduction in brightness was small. The durability and lifetime was thus remarkably enhanced. The primary emission peak wavelength mentioned herein refers to the wavelength at which the emission spectrum exhibits the highest intensity.

Compound 1 exhibited a T1 energy of 1.95 eV and an electron affinity of 2.93 eV. The band gap was 2.82 eV according to an absorption spectrum measured in a dilute solution. Compound b-2 exhibited a T1 energy of 2.03 eV, an electron affinity of 2.72 eV, and a band gap of 2.95 eV. Compound b-2 acting as the host compound exhibited a lower electron affinity than Compound 1 acting as the guest or dopant compound. Hence, the electron affinity of Compound b-2 acting as the host compound is closer to the vacuum level than that of Compound 1 acting as the dopant compound.

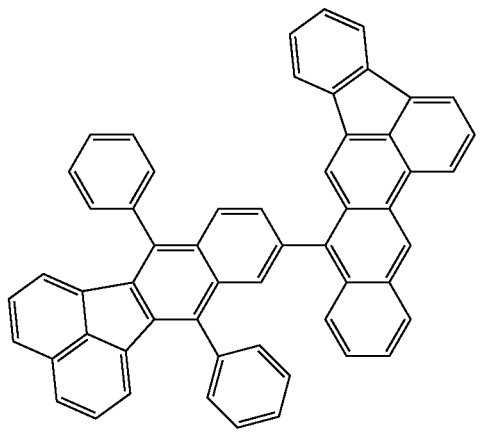

Compound 1

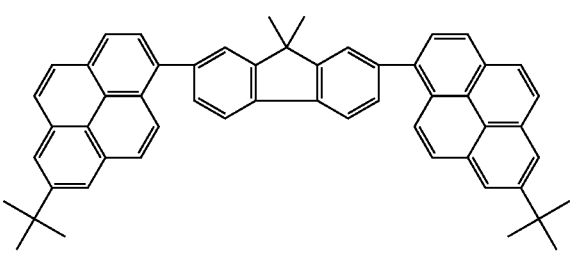

Compound b-2

Other devices prepared by using the following compounds as the dopant compound instead of Compound 1 were also examined. The results are shown in the Table. The chemical formulas of Compounds 2, d-1 and d-2 will be shown later. For measuring the lifetime of the device, a voltage was continuously applied to the device for 100 hours with the current density kept at 33 mA/cm². The lifetime shown in the Table represents the ratio of the brightness after 100-hour continuous application of voltage to the initial brightness.

TABLE

| | Compound | | | |
|---|---|---|---|---|
| | Compound 1 | Compound 2 | Compound d-1 | Compound d-2 |
| Electron affinity (eV) | 2.93 | 2.95 | 2.54 | 3.10 |
| T1 energy (eV) | 1.95 | 1.93 | 1.67 | 2.10 |
| Primary emission peak (nm) | 438 | 449 | 468 | 451 |
| Lifetime | 15% or less | 15% or less | 30% or more | 30% or more |

The above results suggest that an organic blue-light-emitting device using a dopant compound having an energy of 1.95 eV or less in the lowest excited triplet state (T1) and having an electron affinity (Ea) of 2.93 eV or more can have a superior lifetime.

The dopant compound used in the light-emitting layer of an organic light-emitting device according to an embodiment of the invention is not limited to Compound 1. That is, another dopant compound can be used as long as it satisfies both requirements: having an energy of 1.95 eV or less in the lowest excited triplet state (T1); and having an electron affinity (Ea) of 2.93 eV or more. For example, the dopant compound may comprise at least one of an anthracene skeleton and a fluoranthene skeleton.

From the viewpoint of reducing the T1 energy, the dopant compound can have an anthracene skeleton having a low T1 energy. More specifically, such an anthracene skeleton may have a substituent, or may be a skeleton partially including anthracene, such as benzanthracene or indenoanthracene skeleton.

The dopant compound may also have a skeleton capable of enhancing the electron affinity, such as an electron-withdrawing fluoranthene skeleton. More specifically, such a compound may have a fluoranthene skeleton having a substituent, or may have a skeleton partially including fluoranthene, such as benzofluoranthene skeleton.

Furthermore, a skeleton in which an anthracene skeleton and a fluoranthene skeleton are condensed may have a low T1 energy and a high electron affinity, and may thus be suitable.

More specifically, compounds expressed by the following general formulas [I] and [II] can be used.

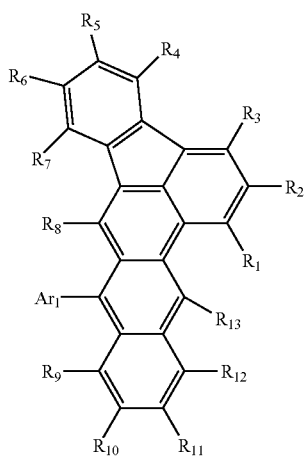

[I]

In formula [I], $R_1$ to $R_{13}$ each represent hydrogen or a substituted or unsubstituted alkyl, and may be the same as or different from each other. $Ar_1$ represents a substituted or unsubstituted condensed polycyclic group.

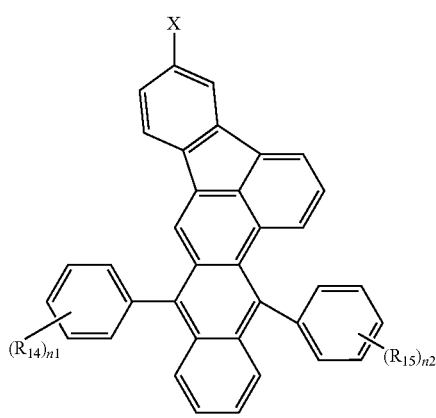

[II]

In formula [II], $R_{14}$ and $R_{15}$ each represent a substituted or unsubstituted alkyl, and may be the same as or different from each other. The n1 and n2 each represent an integer of 0 to 5. When n1 is 2 or more, the groups expressed by $R_{14}$ may be the same as or different from each other, and when n2 is 2 or more, the groups expressed by $R_{15}$ may be the same as or different from each other. X represents a substituted or unsubstituted fluoranthenyl group, or a substituted or unsubstituted benzofluoranthenyl group.

Substituents of the compounds expressed by general formulas [I] and [II] will be further described in detail.

Examples of the alkyl groups represented by $R_1$ to $R_{15}$ include methyl, ethyl, n-propyl, isopropyl, n-butyl, t-butyl, s-butyl, octyl, 1-adamantyl and 2-adamantyl.

Examples of the condensed polycyclic group represented by $Ar_1$ include naphthyl, pentalenyl, anthryl, pyrenyl, indacenyl, acenaphthenyl, phenanthryl, phenalenyl, fluoranthenyl, benzofluoranthenyl, acephenanthryl, aceanthryl, triphenylenyl, chrysenyl, naphthacenyl, perylenyl, pentacenyl and fluorenyl.

Examples of X include a substituted or unsubstituted fluoranthenyl, and benzofluoranthenyl groups such as benzo[k]fluoranthenyl, benzo[b]fluoranthenyl and benzo[j]fluoranthenyl.

The alkyl groups ($R_1$ to $R_{15}$), $Ar_1$ and X may each have a substituent, and examples of the substituent include alkyl, such as methyl, ethyl and propyl; aralkyl, such as benzyl and phenethyl; and aryl, such as phenyl, biphenyl, naphthyl, pyrenyl, fluorenyl and fluoranthenyl.

Exemplary compounds are shown below. However, the dopant compound is not limited to those listed below.

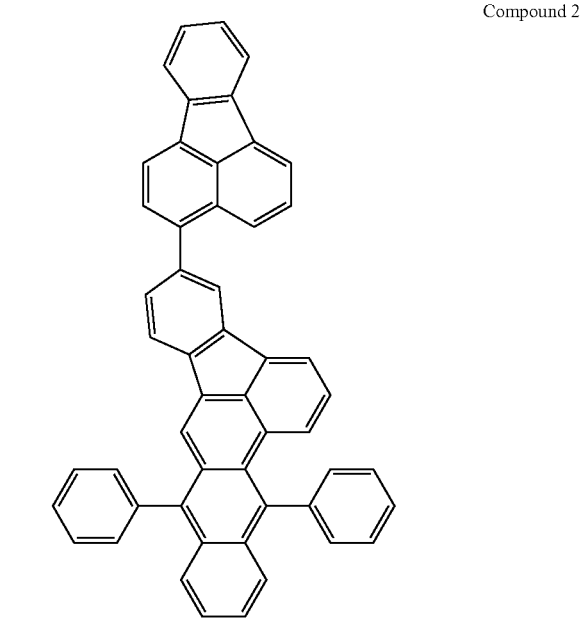

Compound 2

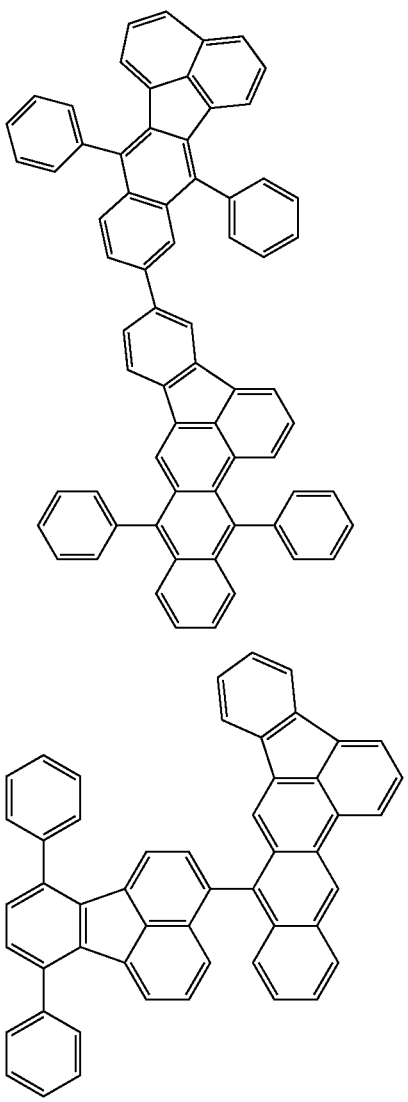

Compound 3

Compound 4

The host compound in the light-emitting layer satisfies the following three requirements. (1) The electron affinity (Ea) of the host compound is lower than that of the dopant compound. (2) The host compound in the lowest excited triplet state (T1) has a higher energy than the dopant compound in the T1 state. (3) The host compound has a larger band gap than the dopant compound.

More specifically, the host compound can be a polymer derivative, and examples of such a host compound include triarylamine derivatives, phenylene derivatives, condensed ring aromatic compounds such as naphthalene derivatives, phenanthrene derivatives, fluorene derivatives, pyrene derivatives, tetracene derivatives, coronene derivatives, chrysene derivatives and 9,10-diphenylanthracene derivatives, pyrazine derivatives, benzoimidazole derivatives, benzothiazole derivatives, benzoxazole derivatives, stilbene derivatives, organic metal complexes such as tris(8-quinolinolate)aluminum and other organic aluminum complexes, organic beryllium complexes, organic iridium complexes and organic platinum complexes, and poly(phenylene vinylene) derivatives, poly(fluorene) derivatives, poly(phenylene) derivatives, poly(thienylene vinylene) derivatives, and poly(acetylene) derivatives.

The light-emitting material contained in the light-emitting layer of an organic compound layer according to an embodiment of the invention refers to a material mainly serving to emit light in a layer mainly serving to emit light of an organic light-emitting device (e.g., may be an organic electroluminescent (EL) device). In a light-emitting layer containing both a host material and a dopant material (or guest material), the light-emitting material refers to the dopant material mainly serving to emit light.

For producing a highly efficient, durable organic light-emitting device, the dopant compound may have a high emission yield and chemical stability.

Such a compound may be a hydrocarbon, which is composed of carbon and hydrogen. Such hydrocarbon compounds include fluorene derivatives, pyrene derivatives, fluoranthene derivatives, benzofluoranthene derivatives, and indenobenzanthracene derivatives. These compounds are condensed polycyclic derivatives exhibiting relatively high fluorescence quantum yield and chemical stability.

The dopant material content in the light-emitting layer can be in the range of 0.1% to 30% by weight, such as in the range of 0.1% to 15% by weight from the viewpoint of preventing concentration quenching.

The light-emitting material in the light-emitting layer of an organic light-emitting device according to an embodiment of the invention has a primary emission peak wavelength in a region suitable for a blue device. Specifically, the primary emission peak wavelength is in the range of 430 to 480 nm, such as 430 to 460 nm.

The electron affinity mentioned herein can be obtained from the measurements of band gap and ionization potential. More specifically, the electron affinity is expressed by the equation: electron affinity=ionization potential−band gap.

The band gap of the dopant compound can be obtained from the UV-visible absorption spectrum. In the examples of the invention, the present inventors obtained the band gap from the absorption edge of a toluene solution of the dopant compound ($1\times10^{-6}$ mol/L). The measurement was performed with a spectrophotometer U-3010 manufactured by Hitachi.

The band gap of the host compound can also be obtained from the UV-visible absorption spectrum. In the examples of the invention, the present inventors obtained the band gap from the absorption edge of a thin film of the host compound formed on a glass substrate. The measurement was performed with a spectrophotometer U-3010 manufactured by Hitachi.

The ionization potentials of the dopant compound and the host compound were measured by atmospheric photoelectron spectroscopy (analyzer: AC-1 manufactured by Riken Keiki). In the examples of the invention, the present inventors obtained the ionization potentials using a thin film formed on a glass substrate.

The T1 energies of the dopant compound and the host compound were obtained from the primary emission peaks of phosphorescence components of toluene solutions of the compounds ($1\times10^{-4}$ mol/L) cooled to 77 K measured at an excitation wavelength of 350 nm. The measurement was performed with a spectrophotometer U-3010 manufactured by Hitachi.

The layers constituting the organic light-emitting device will now be described. An organic light-emitting device includes an organic compound layer between an anode and a cathode. The organic compound layer may have a single-layer structure or a multilayer structure. For example, the organic light-emitting device can have any of the following five exemplary structures.

A first exemplary structure includes a substrate, an anode, a light-emitting layer and a cathode in that order.

A second exemplary structure includes a substrate, an anode, a hole transport layer, an electron transport layer and a cathode in that order. In this instance, the hole transport layer and the electron transport layer may define a light-emitting layer. This structure emits light at the interface between the hole transport layer and the electron transport layer.

A third exemplary structure includes a substrate, an anode, a hole transport layer, a light-emitting layer, an electron transport layer and a cathode in that order.

A fourth exemplary structure includes a substrate, an anode, a hole injection layer, a hole transport layer, a light-emitting layer, an electron transport layer and a cathode in that order.

A fifth exemplary structure includes a substrate, an anode, a hole transport layer, a light-emitting layer, a hole/exciton blocking layer, an electron transport layer and a cathode in that order.

FIGS. 1 to 5 show the five exemplary structures of the organic light-emitting device. The organic light-emitting device shown in FIG. 1 includes a glass substrate 1, an anode 2, a light-emitting layer 3 and a cathode 4. The anode 2 may be disposed at the reflection side. In this instance, the anode 2 is a transparent electrode acting as a reflection member or including a reflection member. When the anode 2 is disposed at the reflection side, the cathode 4 is disposed at the light extraction side. In this instance, the cathode 4 is an optically transparent electrode made of, for example, ITO.

Figure 2:
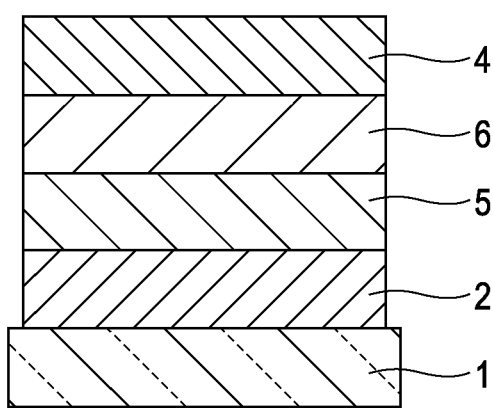
FIG. 2 is a schematic diagram of a second structure of the organic light-emitting device.

FIG. 2 is a schematic view of the second exemplary structure. The structure shown in FIG. 2 is different from that of FIG. 1 in that the light-emitting layer 3 is not provided and in that a hole transport layer 5 and an electron transport layer 6 are disposed between the anode 2 and the cathode 4 in that order from the anode side. Otherwise the second structure is the same as the first structure.

Figure 3:
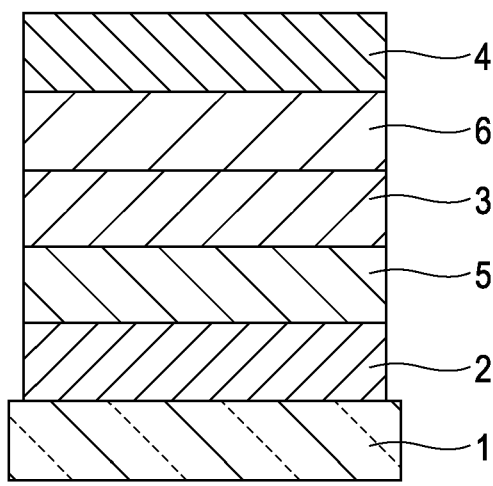
FIG. 3 is a schematic diagram of a third structure of the organic light-emitting device.

FIG. 3 is a schematic view of the third exemplary structure. The structure shown in FIG. 3 is different from that of FIG. 1 in that a hole transport layer 5 is provided between the anode 2 and the light-emitting layer 3 and in that an electron transport layer 6 is provided between the light-emitting layer 3 and the cathode 4. Otherwise the third structure is the same as the first structure.

Figure 4:
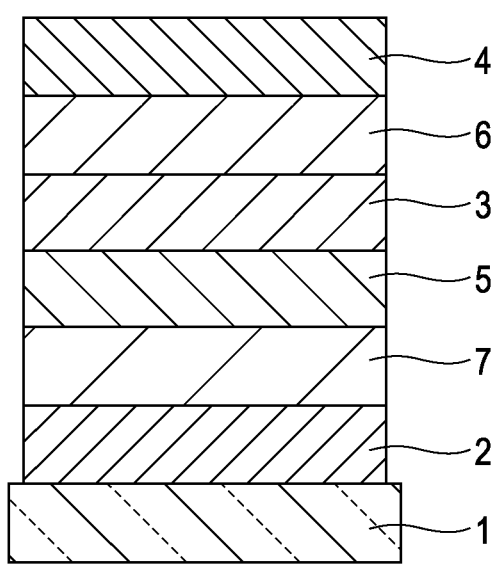
FIG. 4 is a schematic diagram of a fourth structure of the organic light-emitting device.

FIG. 4 is a schematic view of the fourth exemplary structure. The structure shown in FIG. 4 is different from that of FIG. 1 in that a hole injection layer 7 and a hole transport layer 5 are disposed between the anode 2 and the light-emitting layer 3 in that order from the anode side. In addition, an electron transport layer 6 is provided between the light-emitting layer 3 and the cathode 4. Otherwise the fourth structure is the same as the first structure.

Figure 5:
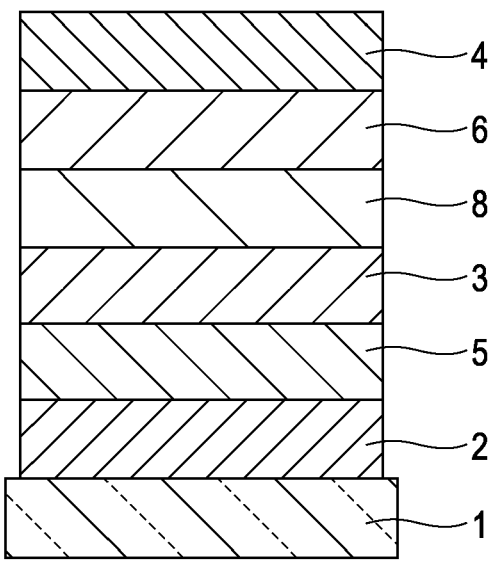
FIG. 5 is a schematic diagram of a fifth structure of the organic light-emitting device.

FIG. 5 is a schematic view of the fifth exemplary structure. The structure shown in FIG. 5 is different from that of FIG. 1 in that a hole transport layer 5 is provided between the anode 2 and the light-emitting layer 3. In addition, a hole/exciton blocking layer 8 and an electron transport layer 6 are provided between the light-emitting layer 3 and the cathode 4 in that order from the light-emitting layer side. The hole/exciton blocking layer 8 blocks holes and/or excitons. Otherwise the fifth structure is the same as the first structure.

However, the organic light-emitting device of an embodiment of the invention is not limited to the above first to fifth structures. For example, the organic light-emitting device of an embodiment of the invention may have an insulating layer between an electrode and an organic layer, or may have an adhesion layer or an interference layer. The hole transport layer may also include two layers having different ionization potentials.

The organic compound layer may contain a hole injecting/transporting material. Desirably, the hole injecting/transporting material has a mobility that facilitates the injection of holes from the anode or transports the injected holes to the light-emitting layer. The hole injecting/transporting material may be a low molecular weight compound or a polymer, and exemplary hole injecting/transporting materials can include, but are not limited to, at least one of triarylamine derivatives, phenylenediamine derivatives, triazole derivatives, oxadiazole derivatives, imidazole derivatives, pyrazoline derivatives, pyrazolone derivatives, oxazole derivatives, fluorenone derivatives, hydrazone derivatives, stilbene derivatives, phthalocyanine derivatives, porphyrin derivatives, poly(vinyl carbazole), poly(silylene), poly(thiophene), and other conductive polymers.

The organic compound layer may contain an electron injecting/transporting material. The electron injecting/transporting material can be a compound that facilitates the injection of ions from the cathode and the transporting of the injected electrons to the light-emitting layer, and can be selected in consideration of, for example, the balance with the carrier mobility of the hole injecting/transporting material. Exemplary electron injecting/transporting materials may include, but are not limited to, at least one of oxadiazole derivatives, oxazole derivatives, triazole derivatives, thiadiazole derivatives, pyrazine derivatives, triazole derivatives, triazine derivatives, perylene derivatives, quinoline derivatives, quinoxaline derivatives, fluorenone derivatives, anthrone derivatives, phenanthroline derivatives, and organic metal complexes. Materials having a high ionization potential may be used for blocking holes.

The organic compound layer of the organic light-emitting device according to an embodiment of the invention can be formed by various methods suitable for forming a light-emitting layer or other organic layers. In general, the organic compound layer may be formed by a thin layer deposition method, such as for example vacuum vapor deposition, ionized vapor deposition, sputtering, or plasma CVD. Alternatively, a thin layer may be formed by a suitable coating method using the material dissolved in a solvent, such as by spin coating, dipping, a cast method, an LB method, or an ink-jet method. For coating, an appropriate binding resin may be used in combination.

The binding resin can be selected from a variety of resins having binding capacity. Such binding resins may include, but are not limited to, at least one of polyvinylcarbazole, polycarbonate, polyester, polyacrylate, polystyrene, ABS resin, polybutadiene, polyurethane, acrylic resin, methacrylic resin, butyral, polyvinyl acetal, polyamide, polyimide, polyethylene, polyethersulfone, diallyl phthalate, phenol resin, epoxy resin, silicone resin, polysulfone, and urea resin. These resins may be used singly, or may be combined to be used as copolymer. A known additive, such as plasticizer, antioxidant or ultraviolet light adsorbent, may be used in combination with the binding resin.

A suitable material for the anode may have as high a work function as possible. Such materials include, for example, elemental metals and their alloys, such as at least one of gold, platinum, silver, copper, nickel, palladium, cobalt, selenium, vanadium and tungsten, and metal oxides, such as tin oxide, zinc oxide, indium oxide, indium tin oxide (ITO) and zinc indium oxide. Electrically conductive materials can also be used, such as polyaniline, polypyrrole, polythiophene and polyphenylene sulfide. These anode materials may be used singly or in combination. The anode may also have a single-layer structure or a multilayer structure.

The material of the cathode may have a relatively low work function. Such materials include, for example, elemental metals, such as at least one of lithium, sodium, potassium, calcium, magnesium, aluminum, indium, ruthenium, titanium, manganese, yttrium, silver, lead, tin and chromium, and alloys, such as lithium-indium, sodium-potassium, magnesium-silver, aluminum-lithium, aluminum-magnesium and magnesium-indium. A metal oxide, such as indium tin oxide (ITO), may be used. These cathode materials may be used singly or in combination. The cathode may have a single-layer structure or a multilayer structure.

At least one of the anode and the cathode can also be transparent or translucent.

The substrate of the light-emitting device of an embodiment of the invention may be opaque like a metal or ceramic substrate, or transparent like glass, quartz, or plastic sheet. The substrate may be provided with a color filter film, a fluorescent color conversion filter film or a dielectric reflection film to control the emitted light color.

As for the direction in which light is emitted, either a bottom emission structure (e.g., light is emitted from the substrate side) or a top emission structure (e.g., light is emitted from the opposite side to the substrate), can be used.

In order to protect the device from oxygen or moisture, a protective layer or a sealing layer may be provided in some embodiments. The protective layer may comprise, for example, a diamond thin film, an inorganic material film such as of metal oxide or metal nitride, a polymer film such as of fluorocarbon polymer, polyparaxylene, polyethylene, silicone resin or polystyrene resin, or a light-curable resin film. According to some embodiment, the light-emitting device may be covered with glass, a gas non-permeable film or a metal, and packaged using an appropriate sealing resin.

An organic light-emitting device according to embodiments of the invention may be installed in a variety of apparatuses.

For example, the organic light-emitting device can be used as a light source (e.g., exposure device), and thus can provide an electrophotographic image forming apparatus.

Two-dimensionally arranged organic light-emitting devices according to embodiments of the invention can define a display portion. Thus, an image display device including the display portion can be provided.

The image display device can include the display portion and a driving portion driving the display portion.

The image display device may be, for example, a display of a personal computer or a TV set.

In addition, the display portion may be used as an operational portion of the touch panel of an electrophotographic image forming apparatus.

Furthermore, by using the image display device as an image display portion, a camera (image pickup apparatus) can be provided, such as a digital still camera or a digital video camera.

The display portion may include a switching device for each organic light-emitting device. The switching device can be, for example, a TFT device. The switching device is connected to the corresponding organic light-emitting device, and switches whether the organic light-emitting device emits light or not.

Figure 6:
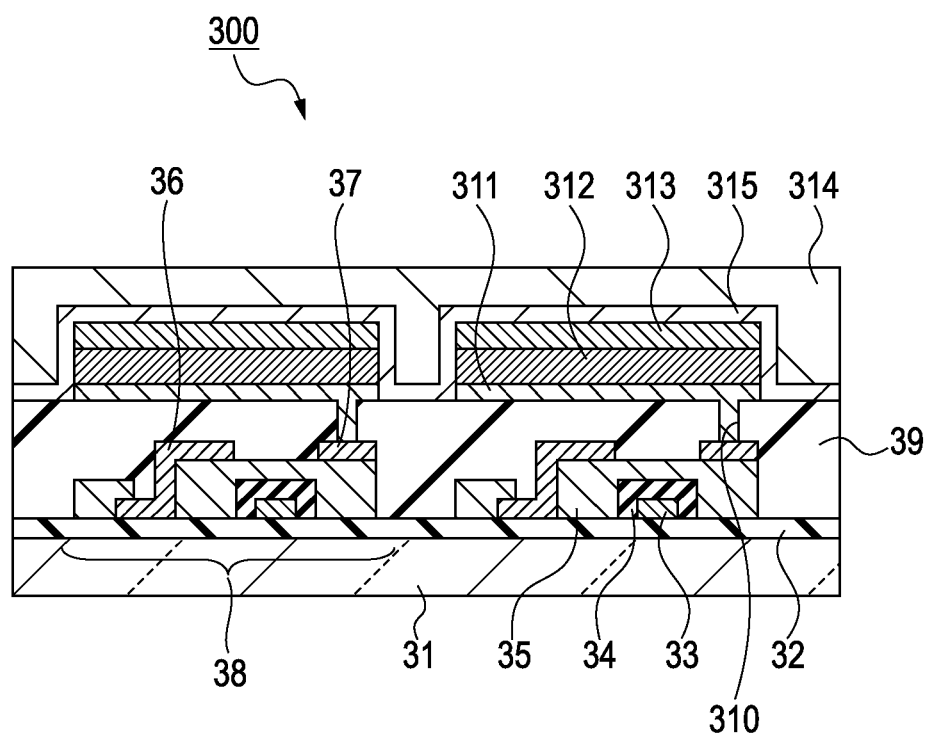
FIG. 6 is a schematic sectional view of an image display device including organic light-emitting devices in a display portion.

FIG. 6 is a schematic sectional view of an embodiment of an image display device including organic light-emitting devices in a display portion. FIG. 6 shows two organic light-emitting devices and two TFTs. One organic light-emitting device is connected to one TFT. In the image display device 300 shown in FIG. 6, reference numeral 38 denotes the TFT device acting as a switching device; 31, a substrate; 32, a moisture-proof layer; 33, a gate electrode; 34, a gate insulating film; 35, a semiconductor layer; 36, a drain electrode; 37, a source electrode; 39, an insulating layer; 310, a contact hole; 311, an anode; 312, an organic layer; 313, a cathode; 314, a first protective layer; and 315, a second protective layer.

The image display device 300 has the moisture-proof layer 32 on the substrate 31, which may be made of glass, to protect the members (TFTs or the organic layer) overlying the substrate 31. The moisture-proof layer 32 may be made of silicon oxide or a composite of silicon oxide and silicon nitride. The gate electrode 33 is disposed on the moisture-proof layer 32. The gate electrode 33 may be formed by depositing a metal, such as Cr, by sputtering.

The gate electrode 33 is covered with the gate insulating film 34. The gate insulating film 34 can be formed by patterning a silicon oxide layer or the like formed by, for example, plasma CVD or catalyzed chemical vapor deposition (cat-CVD). The gate insulating films 34 provided for the respective regions intended for the TFTs by patterning are each covered with the semiconductor layer 35. The semiconductor layer 35 can be formed into a shape along the circuit by patterning a silicon layer formed by, for example, plasma CVD (and annealing at, for example, 290° C. or more, depending on the circumstances).

The semiconductor layer 35 has the drain electrode 36 and the source electrode 37. Each of the thus formed TFT devices 38 includes the gate electrode 33, the gate insulating film 34, the semiconductor layer 35, the drain electrode 36 and the source electrode 37. The insulating layer 39 is disposed over the TFT device 38. The insulating layer 39 has the contact hole (through hole) 310 through which the anode 311 made of a metal for the organic light-emitting device is connected to the source electrode 37.

On the anode 311, the organic layer 312 including a light-emitting layer and the cathode 313 are disposed in that order to form the organic light-emitting device. The organic layer 312 may comprise a plurality of layers including the light-emitting layer, or may comprise only the light-emitting layer. The first protective layer 314 and/or the second protective layer 315 may be provided to prevent the degradation of the organic light-emitting device.

The switching device is not limited to the TFT device, and, for example, an MIM device may also be used.

The organic light-emitting devices of the display portion may emit different color lights. More specifically, each organic light-emitting device may emit any one of the colors of red, green and blue. Thus, full color display can be achieved.

In the use of the organic light-emitting device particularly for a full color image display device of a mobile apparatus, it may be that light emitted from the organic light-emitting device is efficiently used to use the limited voltage source capacity effectively. Accordingly, the optical interference distances of the organic light-emitting devices may be adjusted for each emitted light color to enhance the light extraction efficiency. For example, the optical distance between the light-emitting region of the organic light-emitting device and the reflection surface of the reflection electrode may be ¼ or ¾ of the emission wavelength.

The organic light-emitting devices in the full color image display device may use a phosphorescent material as a light-emitting material for any one of the plurality of colors. By using a phosphorescent material as a light-emitting material, the electrical energy can efficiently be converted to optical energy. In a full color display device using three colors of red, green and blue, a phosphorescent material can be used for either red or green or both.

In order to reduce useless consumption of energy, the conductor lines may have low electric resistance. In a top emission-type organic light-emitting device, the transparent or translucent electrode (e.g., opposite to the electrode on the substrate side) formed over the organic compound layer may tend to have a low electric conductivity. In order to increase the electric conductivity, an electrically conductive material can be disposed between the organic light-emitting devices. The resistance of the electrode region thus can be reduced.

The emission area ratio (aperture ratio) of the organic light-emitting device in the display portion of an image display device can be in the range of 0.4 to 0.8. If the aperture ratio is small, the density of the current applied to the organic light-emitting device is increased so as to ensure the same brightness, and accordingly the load is increased. If the aperture ratio is excessively large, in contrast, the distance between the light-emitting devices is reduced. This makes alignment difficult when layers are formed.

EXAMPLES

Examples of the invention will now be described. However, the present invention is not limited to the examples below.

Example 1

Synthesis of Compound 1

Compound 1 was synthesized according to the following scheme:

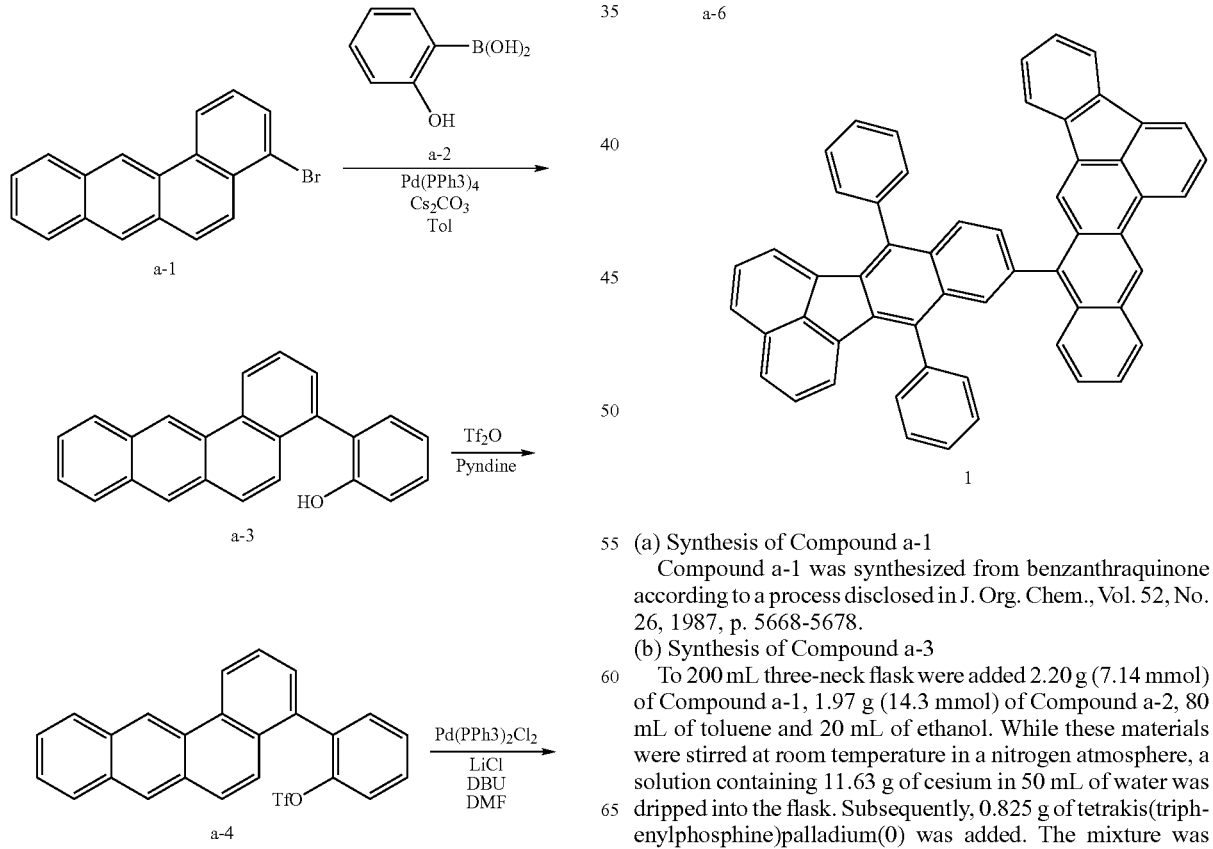

(a) Synthesis of Compound a-1

Compound a-1 was synthesized from benzanthraquinone according to a process disclosed in J. Org. Chem., Vol. 52, No. 26, 1987, p. 5668-5678.

(b) Synthesis of Compound a-3

To 200 mL three-neck flask were added 2.20 g (7.14 mmol) of Compound a-1, 1.97 g (14.3 mmol) of Compound a-2, 80 mL of toluene and 20 mL of ethanol. While these materials were stirred at room temperature in a nitrogen atmosphere, a solution containing 11.63 g of cesium in 50 mL of water was dripped into the flask. Subsequently, 0.825 g of tetrakis(triphenylphosphine)palladium(0) was added. The mixture was heated to 77° C. and stirred for 5 hours. After completion of the reaction, the organic phase was extracted with toluene, dried with anhydrous sodium sulfate, and purified through a silica gel column (toluene-heptane eluent) to obtain 1.51 g (yield: 66%) of Compound a-3 (white yellow crystals).

(c) Synthesis of Compound a-4

To 200 mL three-neck flask were added 1.50 g (4.69 mmol) of Compound a-4 and 50 mL of anhydrous pyridine. While these materials were stirred with ice-cooling in a nitrogen atmosphere, 1.70 mL (9.37 mmol) of trifluoromethane sulfonic acid anhydride ($Tf_2O$) was slowly dripped, followed by stirring for 1 hour. The reaction solution was further stirred at room temperature for 2 hours. After completion of the reaction, 50 mL of waster was added to the reaction solution, and the organic phase was extracted with toluene, dried with anhydrous sodium sulfate, and purified through a silica gel column (toluene-heptane eluent) to obtain 1.65 g (yield: 78%) of Compound a-4 (white yellow crystals).

(d) Synthesis of Compound a-5

To 200 mL three-neck flask were added 1.65 g (3.65 mmol) of Compound a-4, 250 mg of bis(triphenylphosphine)palladium chloride, 7.30 mmol of diazabicycloundecene (DBU), 0.464 g (10.95 mmol) of lithium chloride and 80 mL of dimethylformamide (DMF). The mixture of these materials was heated to 150° C. with stirring in a nitrogen atmosphere, and further stirred for 5 hours. After completion of the reaction, the organic phase was extracted with toluene, dried with anhydrous sodium sulfate, and purified through a silica gel column (toluene-heptane eluent) to obtain 0.830 g (yield: 75%) of Compound a-5 (yellow crystals).

(e) Synthesis of Compound a-6

To 100 ml three-neck flask were added 0.623 g (2.06 mmol) of Compound a-5, 0.804 mg (2.06 mmol) of benzyltrimethylammonium tribromide (BTMA Br3) and 50 ml of chloroform, and the mixture was stirred at room temperature for 5 hours. After completion of the reaction, the reaction solution was filtered. The product was washed with methanol and recrystallized from chlorobenzene/heptane mixture to obtain 0.720 g (yield: 94%) of Compound a-6 (yellow crystals).

(f) Synthesis of Compound 1

To 200 mL three-neck flask were added 0.30 g (0.787 mmol) of Compound a-6, 0.542 g (0.102 mmol) of Compound a-7, 0.30 g (3.90 mmol) of potassium phosphate and 50 mL of dioxane. While the mixture of these materials was stirred at room temperature in a nitrogen atmosphere, 0.825 g of tetrakis(triphenylphosphine)palladium(0) was added, and the mixture was heated to 100° C. and stirred for 5 hours. After completion of the reaction, the organic phase was extracted with toluene, dried with anhydrous sodium sulfate, and purified through a silica gel column (toluene-heptane eluent) to obtain 0.403 g (yield: 72%) of Compound 1 (yellow crystals).

Compound 1 was subjected to mass spectrometry and the molecular ion peak (M+) of Compound 1 was confirmed at 704.

In addition, the structure of the Compound 1 was confirmed by $^1$HNMR analysis.

$^1$H NMR ($CDCl_3$, 400 MHz) σ (ppm): 9.17 (s, 1H), 8.14 (d, 1H), 8.07 (s, 1H), 7.94 (d, 1H), 7.90 (d, 1H), 7.87 (d, 1H), 7.82-7.67 (m, 11H), 7.60-7.27 (m, 12H), 6.72 (d, 1H), 6.61 (d, 1H)

Also, $10^{-6}$ mol/L dilute solution of Compound 1 in toluene exhibited a superior blue color having a peak wavelength at 438 nm. The measurement was performed at an excitation wavelength of 350 nm with a spectrophotofluorometer (F-4500, manufactured by Hitachi).

Compound 1 exhibited a T1 energy of 1.95 eV and an electron affinity of 2.93 eV.

The electron affinity was calculated from the measurements of energy gap and ionization potential. More specifically, the electron affinity is expressed by the equation: electron affinity=ionization potential−energy gap.

The energy gap was obtained from the absorption edge of a solution ($1 \times 10^{-6}$ mol/L) of Compound 1 in toluene. The measurement was performed with a spectrophotometer U-3010 manufactured by Hitachi.

The ionization potential was measured by atmospheric photoelectron spectroscopy (analyzer: AC-1 manufactured by Riken Keiki). Samples for measurements were prepared by forming thin films on a glass substrate. The T1 energy was obtained from the primary emission peak of phosphorescence components of a solution ($1 \times 10^{-4}$ mol/L) of Compound 1 in toluene cooled to 77 K measured at an excitation wavelength of 350 nm. The measurement was performed with a spectrophotometer U-3010 manufactured by Hitachi.

Preparation of Devices

The anode was formed by depositing indium tin oxide (ITO) to a thickness of 120 nm on a glass substrate by sputtering. The resulting structure was used as a transparent electroconductive support substrate. The support substrate was subjected to ultrasonic cleaning with acetone and isopropyl alcohol (IPA) separately, subsequently washed by boiling in IPA, and then dried. The support substrate was further subjected to UV/ozone cleaning.

A hole transport layer was formed to a thickness of 20 nm by spin coating of a chloroform solution of Compound b-1 shown below.

Furthermore, the following organic layers and electrode layers were continuously formed by resistance heating vacuum deposition in a $10^{-5}$ Pa vacuum chamber.

Light-emitting layer (20 nm): Compound 1 (5% by weight), Compound b-2 (95% by weight)
Electron transport layer (40 nm): Compound b-3
Metal electrode layer 1 (0.5 nm): LiF
Metal electrode layer 2 (150 nm): Al Compound b-1

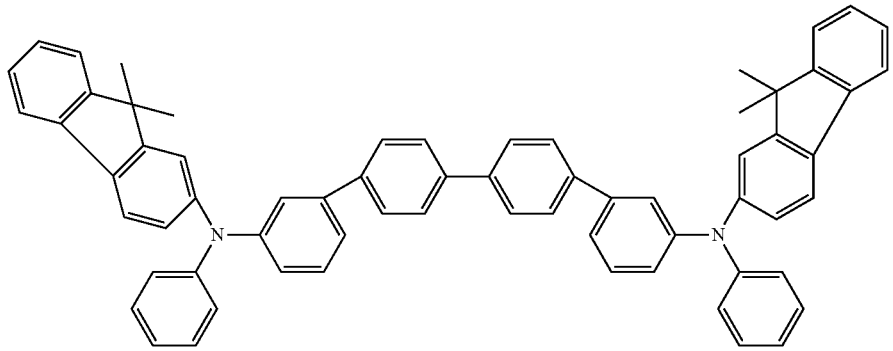

-continued

Compound b-2 Compound b-3

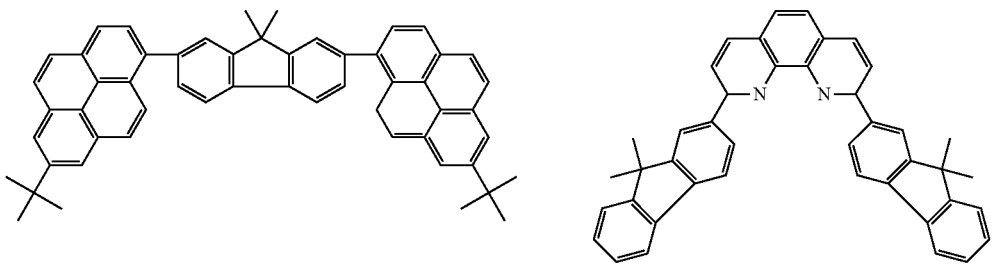

When a voltage of 6.5 V was applied to the resulting organic light-emitting device, superior blue light emission was observed.

When a voltage was further applied in a nitrogen atmosphere continuously for 100 hours with the current density kept at 33 mA/cm$^2$, the brightness was 15% or less reduced from the initial brightness after 100 hours, exhibiting a small degradation.

Example 2

Synthesis of Compound 2

Compound 2 was synthesized according to the following scheme:

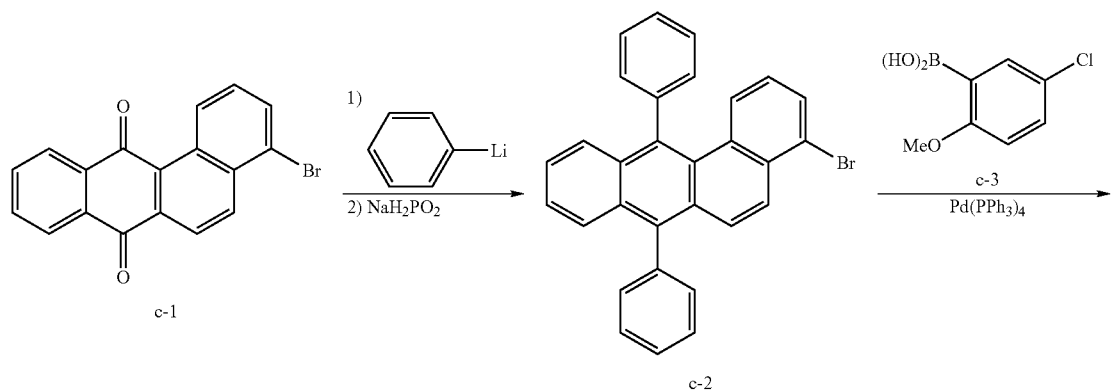

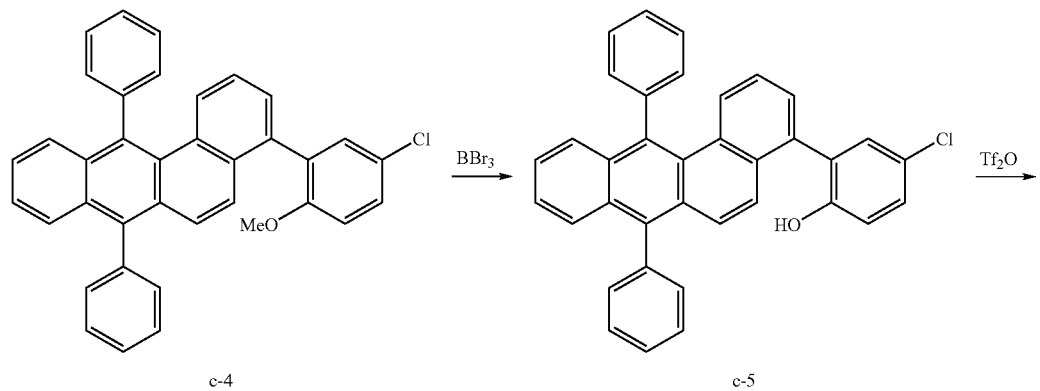

-continued

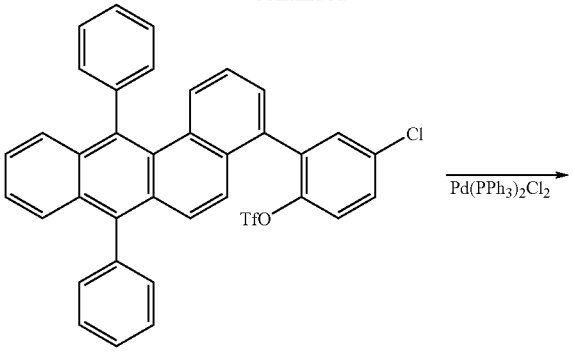

c-6

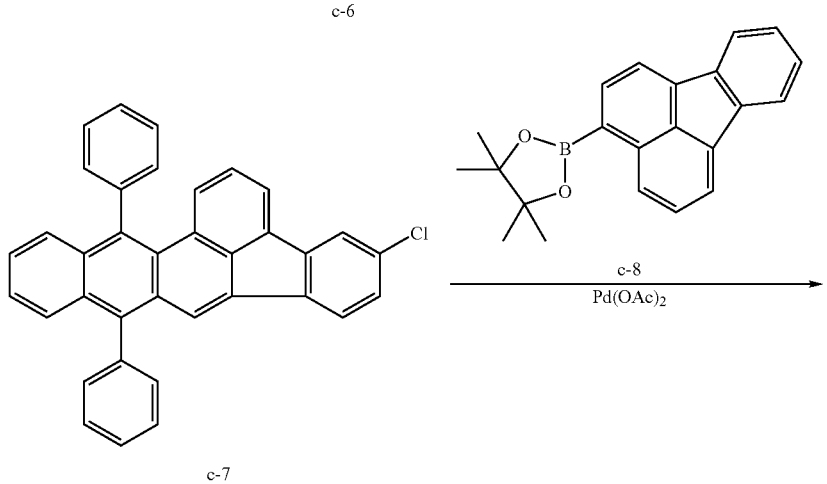

c-7

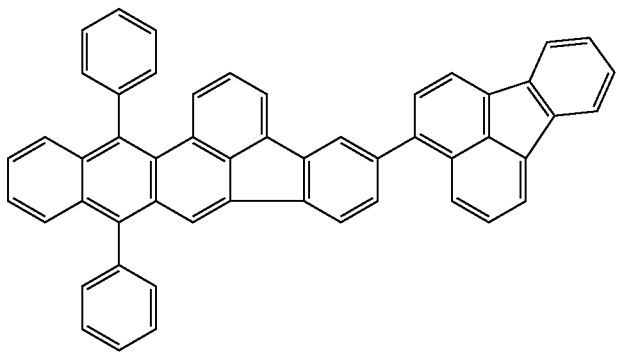

2

(a) Synthesis of Compound c-1

Compound c-1 was synthesized from benzanthraquinone according to a process disclosed in J. Org. Chem., Vol. 52, No. 26, 1987, p. 5668-5678.

(b) Synthesis of Compound c-2

To 100 mL three-neck flask was added 60 mL of tetrahydrofuran, and phenyl lithium (1.08 M) was dripped while the tetrahydrofuran was stirred at −78° C. in a nitrogen atmosphere. Subsequently, 3.37 g (1.0 mmol) of Compound c-1 was slowly added. The mixture was heated to room temperature and stirred for 3 hours. After completion of the reaction, 100 mL of waster was added, and the organic phase was extracted with toluene, dried with anhydrous sodium sulfate, and purified through a silica gel column (toluene-heptane eluent) to obtain 4.5 g of yellow crystals.

Then, to 200 mL three-neck flask were added 4.5 g of the resulting white yellow crystals, 14.9 g (90.0 mmol) of potassium iodide, 19.1 g (180.0 mmol) of sodium phosphate monohydrate and 100 mL of acetic acid. Then, the mixture was heated to reflux for 2 hours. After cooling, the reaction solution was filtered, and the product was washed with water and methanol. The solution was recrystallized from a toluene-heptane mixture to obtain 3.8 g (yield: 82.8%) of Compound c-2 (yellow white crystals).

(c) Synthesis of Compound c-4

To 100 mL three-neck flask were added 2.00 g (4.35 mmol) of Compound c-2, 1.22 g (6.53 mmol) of Compound c-3, 1.85 g (8.70 mmol) of potassium phosphate and 50 mL of dioxane. Subsequently, 0.250 g of tetrakis(triphenylphosphine) palladium(0) was added while the mixture of the materials were stirred at room temperature in a nitrogen atmosphere. The mixture was heated to 100° C. and stirred for 5 hours. After completion of the reaction, the organic phase was extracted with toluene, dried with anhydrous sodium sulfate, and purified through a silica gel column (toluene-heptane eluent) to obtain 0.840 g (yield: 37%) of Compound c-4 (yellow white crystals).

(d) Synthesis of Compound c-5

To 100 mL three-neck flask were added 0.420 g (0.806 mmol) of Compound c-4 and 50 mL of dichloromethane. While the mixture was stirred with ice-cooling in a nitrogen atmosphere, 1.21 mL of boron tribromide was slowly dripped. After stirring for 1 hour, the reaction solution was stirred at room temperature for 8 hours. After completion of the reaction, 50 mL of waster was added to the reaction solution, and the organic phase was extracted with toluene, dried with anhydrous sodium sulfate, and purified through a silica gel column (toluene-heptane eluent) to obtain 0.405 g (yield: 99%) of Compound c-5 (white yellow crystals).

(e) Synthesis of Compound c-6

To 50 mL three-neck flask were added 0.400 g (0.790 mmol) of Compound c-5 and 10 mL of anhydrous pyridine. Subsequently, while the mixture was stirred with ice-cooling in a nitrogen atmosphere, 0.28 mL (1.58 mmol) of trifluoromethane sulfonic acid anhydrate (Tf$_2$O) was slowly dripped. After stirring for 1 hour, the reaction solution was stirred at room temperature for 2 hours. After completion of the reaction, 50 mL of waster was added to the reaction solution, and the organic phase was extracted with toluene, dried with anhydrous sodium sulfate, and purified through a silica gel column (toluene-heptane eluent) to obtain 0.500 g (yield: 99%) of Compound c-6 (white yellow crystals).

(f) Synthesis of Compound c-7

To 50 mL three-neck flask were added 0.500 g (0.782 mmol) of Compound c-6, 56 mg of bis(triphenylphosphine)palladium dichloride, 238 mg (1.56 mmol) of diazabicycloundecene (DBU), 99 mg (2.35 mmol) of lithium chloride and 20 mL of DMF. The mixture was stirred at room temperature in a nitrogen atmosphere, then heated to 150° C., and further stirred for 5 hours. After completion of the reaction, the organic phase was extracted with toluene, dried with anhydrous sodium sulfate, and purified through a silica gel column (toluene-heptane eluent) to obtain 148 mg (yield: 38.7%) of Compound c-7 (yellow white crystals).

(g) Synthesis of Compound 2

To 100 mL three-neck flask were added 0.148 g (0.30 mmol) of Compound c-7, 0.198 g (0.60 mmol) of Compound c-8 (pinacolborane form), 0.127 g (0.60 mmol) of potassium phosphate, 0.127 g (0.60 mmol) of 2-dicyclohexylphosphino-2',6'-diethoxybiphenyl and 50 mL of dioxane. After stirring at room temperature in a nitrogen atmosphere, 0.025 g of palladium acetate was added. Then the mixture was heated to 100° C. and stirred for 5 hours. After completion of the reaction, the organic phase was extracted with toluene, dried with anhydrous sodium sulfate, and purified through a silica gel column (toluene-heptane eluent) to obtain 0.123 g (yield: 63%) of Compound 2 (yellow crystals).

Compound 2 was subjected to mass spectrometry and the molecular ion peak (M+) of Compound 2 was confirmed at 655.

In addition, the structure of the Compound 2 was confirmed by $^1$HNMR analysis.

$^1$H NMR (CDCl$_3$, 400 MHz) σ (ppm): 8.16 (s, 1H), 8.07 (s, 1H), 8.03-7.91 (m, 6H), 7.88 (d, 1H), 7.33-7.53 (m, 16H), 7.46-7.39 (m, 4H), 7.01 (d, 1H)

Also, $10^{-6}$ mol/L dilute solution of Compound 2 in toluene exhibited a superior blue color having a peak wavelength at 439 nm. The measurement was performed at an excitation wavelength of 350 nm with a spectrophotofluorometer (F-4500, manufactured by Hitachi).

Compound 2 exhibited a T1 energy of 1.93 eV, an electron affinity of 2.95 eV.

An organic light-emitting device was prepared in the same manner as in Example 1 except that Compound 1 was replaced with Compound 2, and was subjected to the same evaluation. When a voltage of 6.5 V was applied to the resulting organic light-emitting device, superior blue light emission was observed.

When a voltage was further applied in a nitrogen atmosphere continuously for 100 hours with the current density kept at 33 mA/cm$^2$, the brightness was reduced by 15% or less from the initial brightness after 100 hours, exhibiting only a small degradation.

Example 3

An organic light-emitting device was prepared in the same manner as in Example 1 except that Compound 1 was replaced with Compound 3, and was subjected to the same evaluation. When a voltage of 6.5 V was applied to the resulting organic light-emitting device, superior blue light emission was observed.

When a voltage was further applied in a nitrogen atmosphere continuously for 100 hours with the current density kept at 33 mA/cm$^2$, the brightness was reduced by 15% or less from the initial brightness after 100 hours, exhibiting only a small degradation.

Comparative Examples 1

The physical properties of Compound d-1 shown below were measured in the same manner as in Example 1.

Compound d-1

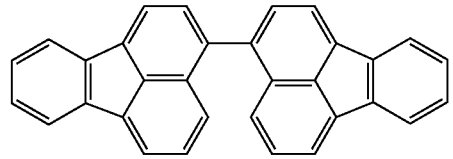

As a result, $10^{-6}$ mol/L dilute solution of Compound d-1 in toluene exhibited a superior blue color having a peak wavelength at 466 nm. The measurement was performed at an excitation wavelength of 350 nm with a spectrophotofluorometer (F-4500, manufactured by Hitachi).

Compound d-1 exhibited a T1 energy of 2.10 eV and an electron affinity of 3.16 eV.

An organic light-emitting device was prepared in the same manner as in Example 1 except that Compound 1 was replaced with Compound d-1, and was subjected to the same evaluation. When a voltage of 6.5 V was applied to the resulting organic light-emitting device, superior blue light emission was observed.

When a voltage was further applied in a nitrogen atmosphere continuously for 100 hours with the current density kept at 33 mA/cm$^2$, the brightness was considerably reduced by 30% or more from the initial brightness after 100 hours.

Comparative Example 2

The physical properties of Compound d-2 shown below were measured in the same manner as in Example 1.

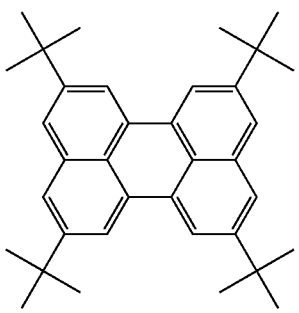

Compound d-2

As a result, $10^{-6}$ mol/L dilute solution of Compound d-2 in toluene exhibited a superior blue color having a peak wavelength at 468 nm. The measurement was performed at an excitation wavelength of 350 nm with a spectrophotofluorometer (F-4500, manufactured by Hitachi).

Compound d-2 exhibited a T1 energy of 1.69 eV and an electron affinity of 2.69 eV. An organic light-emitting device was prepared in the same manner as in Example 1 except that Compound 1 was replaced with Compound d-2, and was subjected to the same evaluation. When a voltage of 6.5 V was applied to the resulting organic light-emitting device, superior blue light emission was observed.

When a voltage was further applied in a nitrogen atmosphere continuously for 100 hours with the current density kept at 33 mA/cm$^2$, the brightness was considerably reduced by 30% or more from the initial brightness after 100 hours.

Accordingly, the examples demonstrate that embodiments of the present invention can provide an efficient, bright and durable organic blue-light-emitting device.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Patent Application No. 2008-314613 filed Dec. 10, 2008 and No. 2009-209539 filed Sep. 10, 2009, which are hereby incorporated by reference herein in their entirety.

What is claimed is:

1. An organic light-emitting device comprising:
a pair of electrodes including an anode and a cathode; and
a light-emitting layer comprising a host compound and a dopant compound that is disposed between the pair of electrodes, the dopant compound being a hydrocarbon compound and emitting light that is emitted from the light-emitting device, the light exhibiting an emission spectrum having a primary emission peak having the highest intensity in the range of wavelengths of 430 to 480 nm, the dopant compound having an electron affinity of 2.93 eV or more that is higher than the host compound, the dopant compound in the lowest excited triplet state having an energy of 1.95 eV or less that is lower than the host compound in the lowest excited triplet state, and the dopant compound having a smaller band gap than the host compound,
wherein the dopant compound is a compound expressed by at least one of the following general formulas [I] and [II] below:

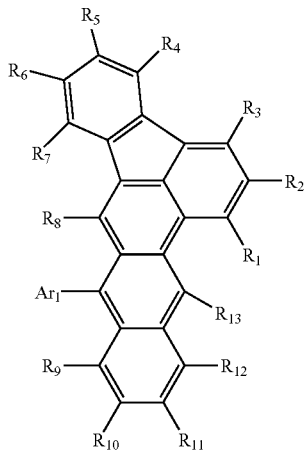

[I]

wherein in the formula [I], $R_1$ to $R_{13}$ each represent hydrogen or a substituted or unsubstituted alkyl, and are the same as or different from each other; and $Ar_1$ represents a substituted or unsubstituted condensed polycyclic group, and

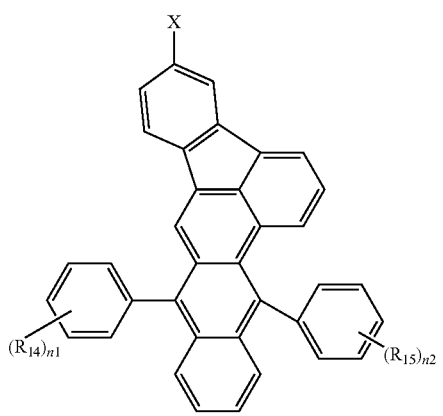

[II]

wherein in the formula [II], $R_{14}$ and $R_{15}$ each represent a substituted or unsubstituted alkyl, and are the same as or different from each other;

n1 and n2 each represent an integer of 0 to 5, wherein when n1 is 2 or more, the groups expressed by $R_{14}$ are the same as or different from each other, and when n2 is 2 or more, the groups expressed by $R_{15}$ are the same as or different from each other;

X represents a substituted or unsubstituted fluoranthenyl group, or a substituted or unsubstituted benzofluoranthenyl group.

2. The organic light-emitting device according to claim 1, wherein the dopant compound comprises at least one of Compounds 1, 2, 3 and 4 below:

Compound 1
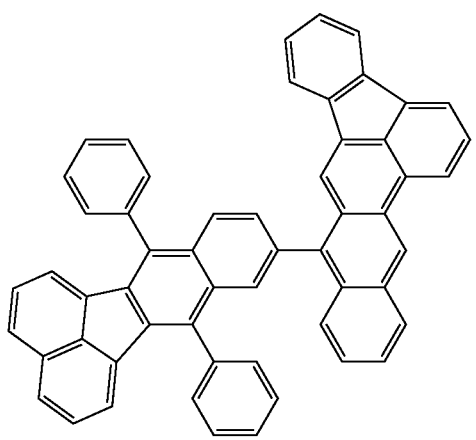
Compound 3
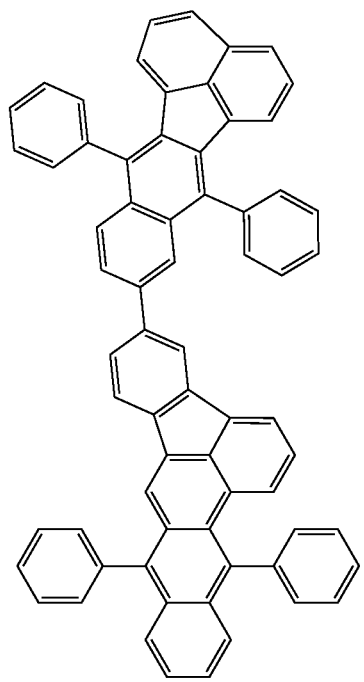
Compound 2
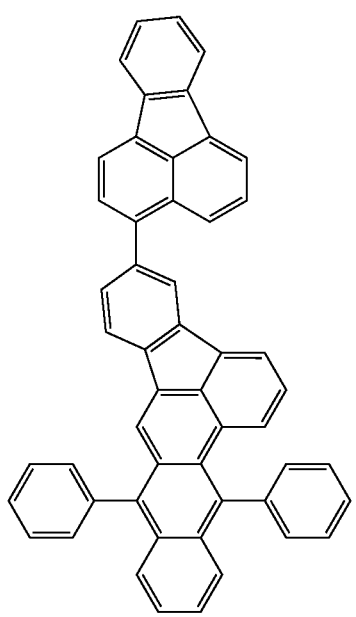
Compound 4
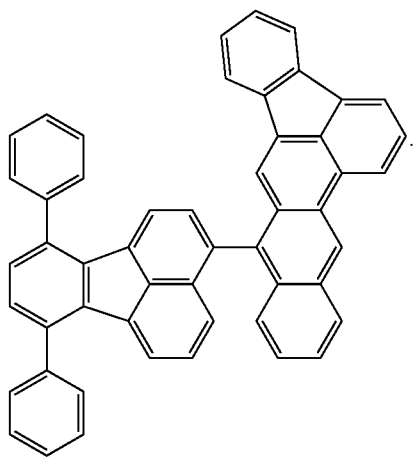

3. The organic light-emitting device according to claim 2, wherein the dopant compound comprises:
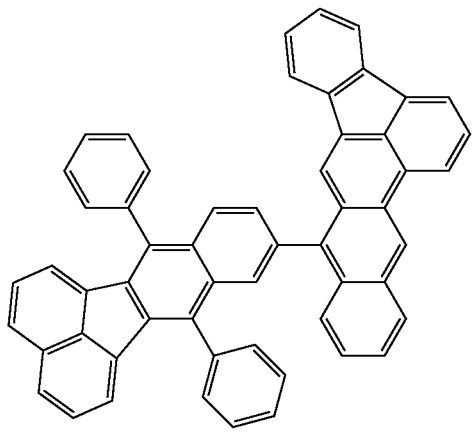 [SMILES: c1ccc(-c2c3c(c(-c4ccccc4)c4cc(-c5c6ccccc6cc6c5cc5c7c(cccc76)-c6ccccc6-5)ccc24)-c2cccc4cccc-3c24)cc1]
and the host compound comprises:
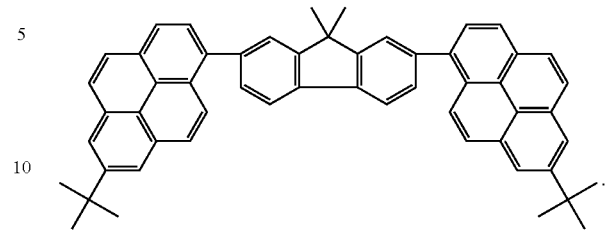
4. An image display device comprising:
a display portion including an organic light-emitting device as set forth in claim 1 and a switching device connected to the organic light-emitting device.
* * * * *